US009202733B2

(12) United States Patent
Hosek

(10) Patent No.: US 9,202,733 B2
(45) Date of Patent: Dec. 1, 2015

(54) ROBOT SYSTEM WITH INDEPENDENT ARMS

(71) Applicant: Persimmon Technologies Corporation, Wakefield, MA (US)

(72) Inventor: Martin Hosek, Lowell, MA (US)

(73) Assignee: Persimmon Technologies Corporation, Wakefield, MA (US)

( * ) Notice: Subject to any disclaimer, the term of this patent is extended or adjusted under 35 U.S.C. 154(b) by 25 days.

(21) Appl. No.: 13/670,004

(22) Filed: Nov. 6, 2012

(65) Prior Publication Data

US 2013/0121798 A1    May 16, 2013

Related U.S. Application Data

(60) Provisional application No. 61/628,825, filed on Nov. 7, 2011.

(51) Int. Cl.
*B66C 23/00* (2006.01)
*H01L 21/677* (2006.01)
*B25J 18/00* (2006.01)
*B25J 9/04* (2006.01)
*B25J 11/00* (2006.01)

(52) U.S. Cl.
CPC ............... *H01L 21/677* (2013.01); *B25J 9/043* (2013.01); *B25J 11/0095* (2013.01); *B25J 18/00* (2013.01); *H01L 21/67742* (2013.01); *H01L 21/67766* (2013.01); *Y10S 901/23* (2013.01); *Y10T 74/20317* (2015.01)

(58) Field of Classification Search
CPC ................... H01L 21/68707; H01L 21/67742; H01L 21/67778; H01L 21/677; H01L 21/67766; B25J 9/041; B25J 9/042; B25J 9/104; B25J 15/04; B25J 15/0616; B25J 18/00; B25J 9/043; B25J 11/0095; B05B 13/0292; Y10S 414/135; Y10S 414/141; Y10S 901/15; Y10S 901/21; Y10S 901/29; Y10S 901/16; Y10S 901/23; Y10T 74/20317
See application file for complete search history.

(56) References Cited

U.S. PATENT DOCUMENTS

| | | | |
|---|---|---|---|
| 4,715,921 A | 12/1987 | Maher et al. |
| 4,730,976 A | 3/1988 | Davis et al. |
| 5,180,276 A | 1/1993 | Hendrickson |
| 5,376,862 A | 12/1994 | Stevens |
| 5,404,894 A | 4/1995 | Shiraiwa |
| 5,539,266 A | 7/1996 | Stevens |
| 5,647,724 A | 7/1997 | Davis, Jr. et al. |
| 5,720,590 A | 2/1998 | Hofmeister |
| 5,765,983 A | 6/1998 | Caveney et al. |
| 5,813,823 A | 9/1998 | Hofmeister |
| 5,882,413 A | 3/1999 | Beaulieu et al. |

(Continued)

OTHER PUBLICATIONS

U.S. Appl. No. 61/627,030, Hosek et al.

*Primary Examiner* — Stephen Vu
(74) *Attorney, Agent, or Firm* — Iandiorio Teska & Coleman, LLP

(57) ABSTRACT

A substrate handling robot drive includes a drive chassis for one or more robot arms. A first housing is movable with respect to the chassis and includes at least a first shaft and a first motor subsystem for driving the first shaft. A Z-axis drives the first housing. A second housing is movable with respect to the chassis and includes at least a second shaft and a second motor subsystem for driving the second shaft. A Z-axis drive for the second housing is independently movable with respect to the Z-axis drive for the first housing.

14 Claims, 11 Drawing Sheets

(56) References Cited

U.S. PATENT DOCUMENTS

| | | |
|---|---|---|
| 5,899,658 A | 5/1999 | Hofmeister |
| 6,208,751 B1 | 3/2001 | Almogy |
| 6,297,611 B1 * | 10/2001 | Todorov et al. .......... 318/568.21 |
| 6,305,694 B1 | 10/2001 | Yamazumi et al. |
| 6,363,808 B1 | 4/2002 | Wakabayashi et al. |
| 6,451,118 B1 | 9/2002 | Garriga |
| 6,485,250 B2 | 11/2002 | Hofmeister |
| 6,857,635 B1 | 2/2005 | Li et al. |
| 7,090,222 B2 | 8/2006 | Watanabe et al. |
| 7,704,036 B2 | 4/2010 | Sato |
| 7,891,935 B2 | 2/2011 | Kremerman |
| 2001/0036398 A1 * | 11/2001 | Hofmeister ................ 414/744.1 |
| 2002/0066330 A1 * | 6/2002 | Namba et al. .............. 74/490.01 |
| 2006/0099063 A1 | 5/2006 | Pietrantonio et al. |
| 2009/0003976 A1 * | 1/2009 | Hofmeister et al. .......... 414/217 |
| 2009/0087288 A1 * | 4/2009 | Hofmeister et al. ..... 414/222.02 |

* cited by examiner

ROBOT SYSTEM WITH INDEPENDENT ARMS

RELATED APPLICATIONS

This application claims benefit of and priority to U.S. Provisional Application Ser. No. 61/628,825 filed Nov. 7, 2011 under 35 U.S.C. §§119, 120, 363, 365, and 37 C.F.R. §1.55 and §1.78 and is incorporated herein by this reference.

FIELD

Embodiments relate to robots, typically substrate (e.g., wafer) handling robots.

BACKGROUND

Conventional manufacturing technologies for semiconductor integrated circuits and flat panel displays may include processing of silicon wafers and glass panels, often referred to as substrates, in fully automated vacuum cluster tools. A typical cluster tool may include a circular vacuum chamber with load locks and process modules connected radially to the circumference of the chamber in a star pattern. The tool is typically serviced by a robotic manipulator (robot) which is located near the center of the chamber and cycles the substrates from the load locks through the process modules and back to the load locks. Another robot may be located in an atmospheric transfer module which serves as an interface between the load locks of the vacuum chamber and standardized load ports serviced by an external transportation system.

A conventional vacuum environment robotic manipulator typically includes a drive unit and one or more arms actuated by the drive unit. The drive unit often houses rotary motion axes, which are necessary to actuate the arm(s), and a vertical lift axis that allows the arm(s) to access stations at different elevations as well as to pick/place substrates from/to the stations. Conventional arm designs may include telescoping, SCARA-type, and frog-leg mechanisms.

In some applications, a vacuum robotic manipulator is required to replace a processed substrate with a fresh substrate. This operation, typically referred to as a substrate exchange, often directly affects the throughput performance of the cluster tool, i.e., the number of substrates processed by the tool per hour. In order to complete a substrate exchange operation, a single-end-effector robotic manipulator typically picks the processed substrate from the workstation, places it to a specified location, picks a fresh substrate from another location, and places it to the workstation. This sequence typically requires a total of thirteen discrete moves. The number of moves, and thus the substrate exchange time, can be improved substantially by utilizing a robot with two or more end-effectors, e.g., as disclosed in U.S. Pat. No. 7,891,935 incorporated herein by this reference. In this case, the robot picks the processed substrate by one end-effector and replaces it by a fresh substrate readily available on another end-effector, thus reducing substantially the number of moves on the critical path.

The drawback of some robots with two or more end-effectors may be the two or more arms that carry the end-effectors are coupled and may not be able to perform independent rotational and vertical moves. Considering the above described fast swap operation as an example, the arm with the processed substrate needs to wait for the arm with the fresh substrate to complete the place operation before it can start to move to another station.

SUMMARY

Significant throughput gains may be achieved by utilizing arms with independent rotational and vertical motion.

SUMMARY OF INVENTION: II

Featured is a substrate handling robot drive comprising a drive chassis for one or more robot arms. A first housing is movable with respect to the chassis and includes at least a first shaft and a first motor subsystem driving the first shaft. A Z-axis drives the first housing. A second housing is movable with respect to the chassis includes at least a second shaft and a second motor subsystem driving the second shaft. A Z-axis drive for the second housing is independently movable with respect to the Z-axis drive for the first housing.

The first and second shafts may be co-axial and independently rotatable. The Z-axis drive for the first housing may include a first motor driven screw in the chassis and a ball assembly attached to the first housing and driven by the first motor driven screw. The Z-axis drive for the second housing may include a second motor driven screw in the chassis and a ball assembly attached to the housing and driven by the second motor driven screw.

In another design, the Z-axis drive for the first housing includes a screw in the chassis and a motor driven ball assembly associated with the first housing and the Z-axis drive for the second housing includes another motor driven ball assembly associated with the second housing and the screw.

The substrate handling robot drive may further include at least a first guide rail attached to the chassis, at least one bearing associated with the first housing and the first guide rail, and at least one linear bearing associated with the second housing and the first rail.

Also featured is a substrate transport robot comprising a first housing movable with respect to a chassis, the first housing having at least a first shaft rotatable about an axis. A second housing is movable with respect to the chassis, the second housing having at least a second shaft rotatable about said axis independently of rotation of said first shaft about said axis. The first housing is movable in an axial direction with respect to said axis independent of the second housing.

The first housing movable in the axial direction of the axis may include a first screw rotatable in the chassis adapted to drive a first ball assembly associated with the first housing. The second housing may be movable in the axial direction of the axis and includes a second screw rotatable in the chassis adapted to drive a second ball assembly associated with the second housing. The first housing movable in the axial direction of the axis may include a first ball assembly associated with the first housing rotatable about a fixed screw attached to the chassis. The second housing may be movable in the axial direction of the axis and includes a second ball assembly associated with the second housing rotatable about the fixed screw attached to the chassis. The first and second housings may be guided on a common rail.

Also featured is a substrate robot method including rotating a first substrate handling robot arm, rotating a second substrate robot arm independently of rotation of said first substrate handling robot arm, lifting and lowering the first substrate handling robot arm, and lifting and lowering the second substrate handling robot arm independently of lifting and lowering the first substrate handling robot arm.

The method may include lifting and lowering the first substrate handling robot arm independently of rotating said first substrate handling robot arm and lifting and lowering the second substrate handling robot arm independently of rotating the second substrate handling robot arm. The lifting and lowering may include guiding. The lifting and lowering may include guiding the first substrate handling robot arm and the second substrate handling robot arm on a common rail. The lifting and lowering may include lifting and lowering the first substrate handling robot arm and the second substrate handling robot arm with a common screw.

The subject invention, however, in other embodiments, need not achieve all these objectives and the claims hereof should not be limited to structures or methods capable of achieving these objectives.

BRIEF DESCRIPTION OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
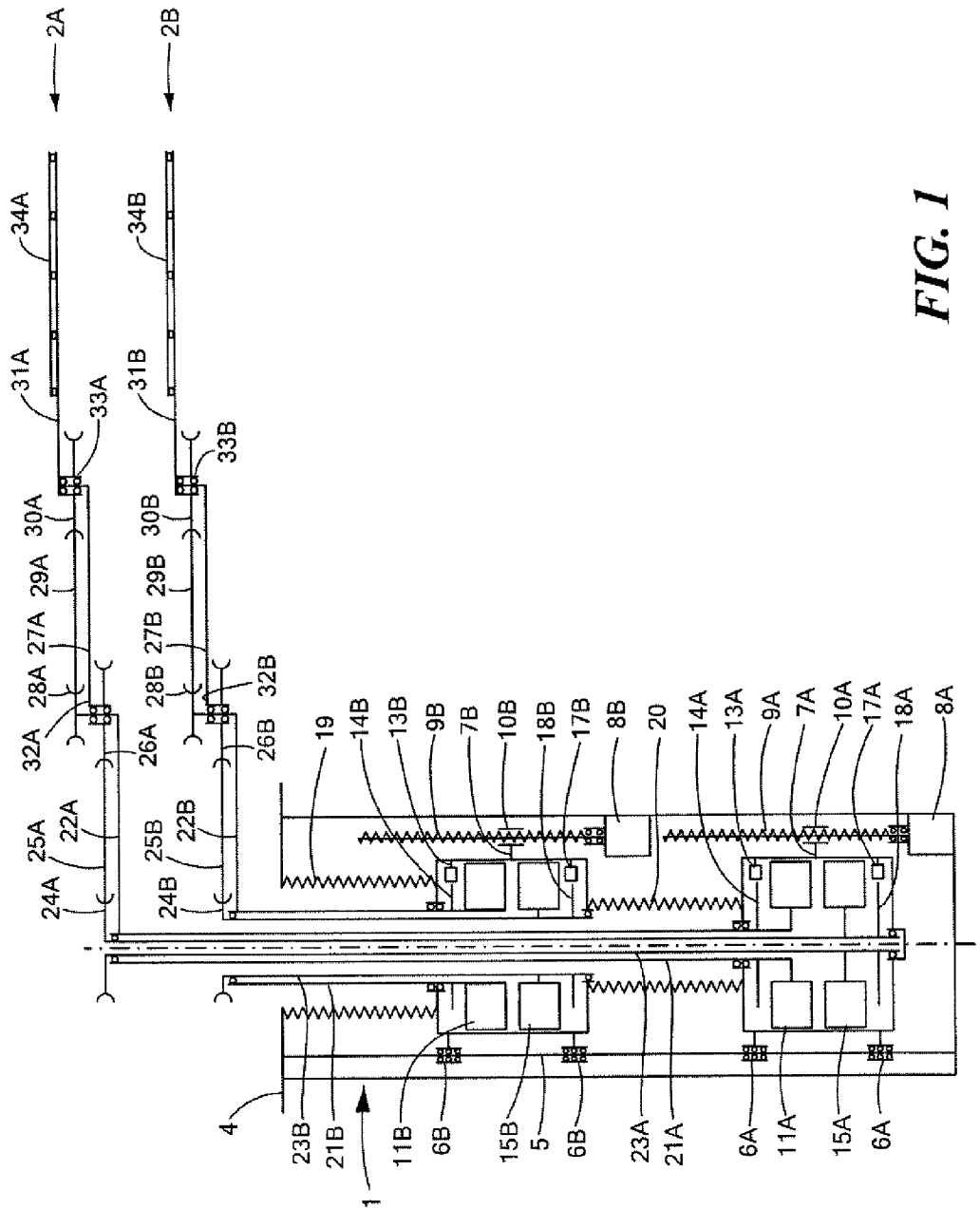
FIG. 1 is a schematic cross sectional view showing one example of a substrate handling drive in accordance with one embodiment.

Aside from the embodiment or embodiments disclosed below, the disclosed embodiment or embodiments are capable of other embodiments and of being practiced or being carried out in various ways. Thus, it is to be understood that the disclosed embodiment or embodiments are not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

In the example of FIG. 1, the robot system may include drive unit which may enable a plurality of rotary motion axes and vertical lift motion axes and multiple arm assemblies, e.g., arm assemblies 2A and 2B driven by the drive unit. Drive unit chassis 1 may be suspended from mounting arrangement 4. Alternatively, the mounting arrangement may be on the side, at the bottom, or the drive unit may be mounted in any other suitable manner. Unit 1 may include one or more vertical rails 5 with linear bearings 6A to provide guidance to movable housing 7A vertically driven by screw 9A rotated by motor 8A. Ball assembly 10A is fixed to housing 7A and is driven by screw 9A. In this example, only one guide rail 5 is shown for simplicity. Motor 8A, screw 9A, and ball 10A may form the Z-axis drive for housing 7A.

Housing 7A, itself, may incorporate two rotary motion axes. The first rotary motion axis of housing 7A may comprise a motor, 11A (e.g., a stator/rotor pair), and a position encoder, including, for example, encoder read-head 13A and encoder disk 14A for shaft 21A. The second rotary motion axis incorporated into housing 7A may include another motor 15A and a position encoder, comprising, for example, encoder read-head 17A and encoder disk 18A for shaft 23A.

The one or more vertical rails 5 may be further utilized to support linear bearings 6B attached to another movable housing 7B which may be driven by motor 8B via screw 9B and ball assembly 10B. Motor 8B and screw 9B with ball 10B may form the second Z-axis drive. Housing 7B may include additional two rotary motion axes. The first rotary motion axis incorporated into housing 7B may comprise a motor 11B and a position encoder, comprising, e.g., encoder read-head 13B and encoder disk 14B for shaft 21B. The second rotary motion axis of housing 7B may comprise a motor 15B and a position encoder, including, for instance, encoder read-head 17B and encoder disk 18B for shaft 23B.

In one design, bellows 19 may be used to accommodate motion of housing 7B along rail(s) 5 separating the environment where motor rotors and encoder disks operate, for example, in a vacuum from the outside environment, e.g., the atmosphere. Similarly, bellows 20 may be used to accommodate motion of housing 7A along rail(s) 5 separating the environment where motor rotors and encoder disks operate, for example, in a vacuum from the outside environment, e.g., the atmosphere.

Motor 11A may drive hollow shaft 21A which may be connected to first link 22A of arm assembly 2A. Similarly, motor 15A may be connected to coaxial inner shaft 23A which may be coupled (via a belt drive comprising, for example, pulley 24A, belt 25A and pulley 26A) to second link 27A. Another belt arrangement including, for example, pulley 28A, belt 29A and pulley 30A may be employed to maintain radial orientation of end-effector 31A regardless of the position of links 22A and 27A. In one example, this may be achieved due to a 1:2 ratio between pulley 28A incorporated into first link 22A and pulley 30A connected to end-effector 31A. First link 22A and second link 27A may be coupled via rotary joint 32A and second link 27A and end-effector 31A may be coupled through rotary joint 33A. End-effector 31A may carry payload 34A, for example, a semiconductor substrate.

Motor 11B may drive hollow outer shaft 21B which may be connected to first link 22B of arm assembly 2B. Similarly, motor rotor 15B may be connected to coaxial inner shaft 23B, which may be coupled (via a belt drive comprising, for example, pulley 24B, belt 25B and pulley 26B) to second link 27B. Another belt arrangement including, for example, pulley 28B, belt 29B and pulley 30B may be employed to maintain radial orientation of end-effector 31B regardless of the position of links 22B and 27B. In one example, this may be achieved due to a 1:2 ratio between pulley 28B incorporated into first link 22B and pulley 30B connected to end-effector 31B. First link 22B and second link 27B may be coupled via rotary joint 32B, and second link 27B and end-effector 31B may be coupled through rotary joint 33B. End-effector 31B may carry payload 34B, for instance, a semiconductor substrate.

Links 22A and 27A of arm assembly 2A and links 22B and 27B of arm assembly 2B may be arranged in an interlaced manner in order to prevent interference of arm assembly 2B with shaft 21A. For example, the following order (bottom to top) of the links may be used: 22B, 22A, 27B and 27A.

Figure 2:
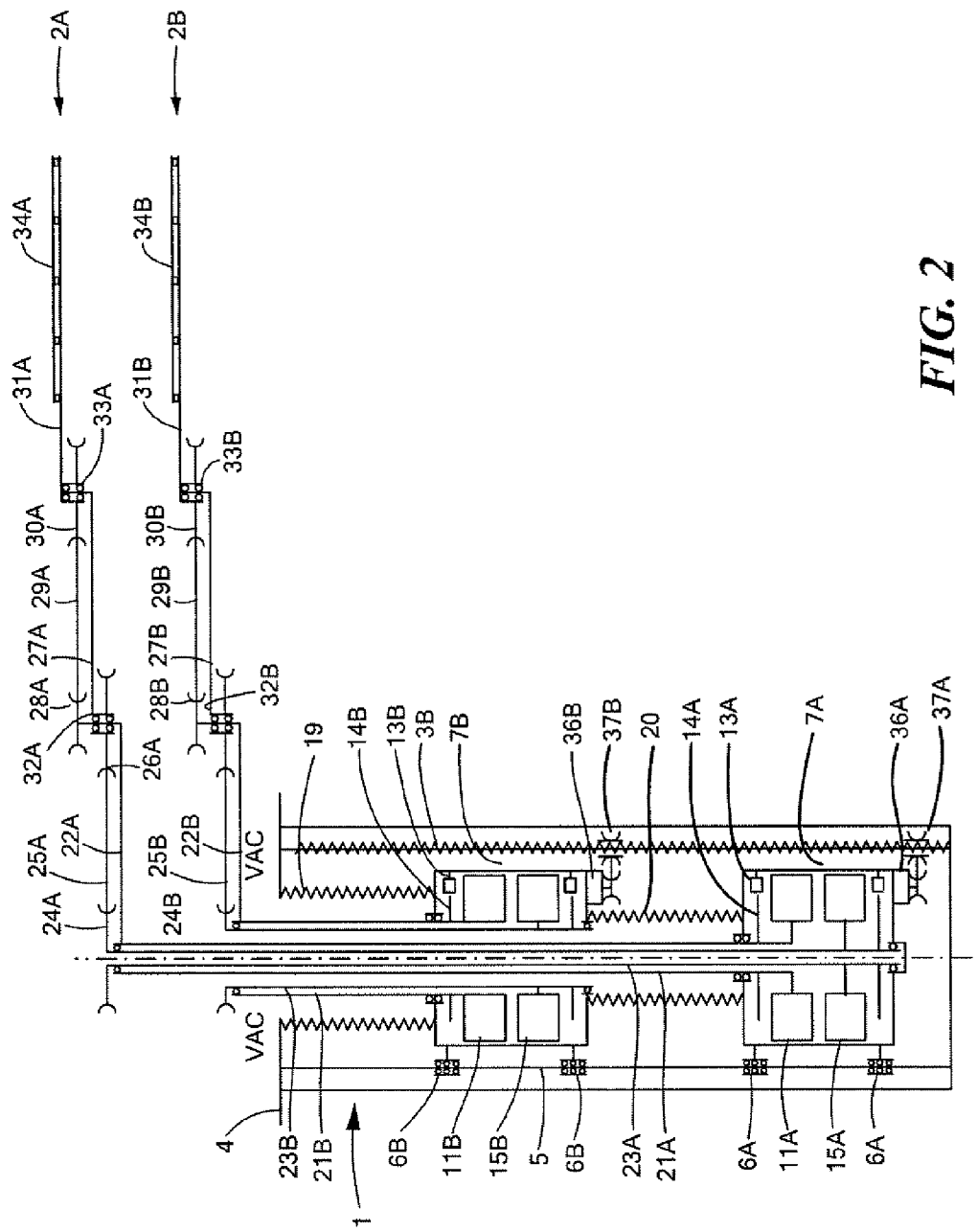
FIG. 2 is a schematic cross sectional view showing another embodiment of a substrate handling robot drive.

In another example, a system shown in FIG. 2 with independent arms may include drive unit 1 with single screw 35 which may be stationary with respect to the housing. In this example, vertical lift motor 36A may be attached to housing 7A and drive, for example, directly or through a belt drive, ball assembly 37A coupled to screw 35. Similarly, vertical lift motor 36B may be attached to housing 7B and drive ball assembly 37B coupled to screw 35. In another design, housing 7A and housing 7B may be driven by a linear motor or coupled to the unit in any other suitable movable manner.

Housing 7A and housing 7B may have an internal motor configuration (rotors internal to stators) and a radial position encoder configuration (encoder read-heads arranged radially with respect to encoder disks). In other designs, the various motor and encoder arrangements used in housing 7A and housing 7B may employ external motor configurations. See U.S. Pat. No. 6,363,808 incorporated by reference herein. In addition, as a feature of one or more embodiments of the robot system with independent awls of this invention, the motors in each housing, whether configured in an internal or external arrangement, may be located coaxially in the same plane (as opposed to being stacked). The stators may be located in vacuum, and a separation wall between the stators and rotors may be used, magnetic couplers may be employed or another sealing arrangement may be used.

In the examples shown, four rotary motion axes, two vertical lift axes, and two arms are shown. However, in other examples, any number of rotary motion axes, vertical lift axes, and arms may be used.

Figure 3:
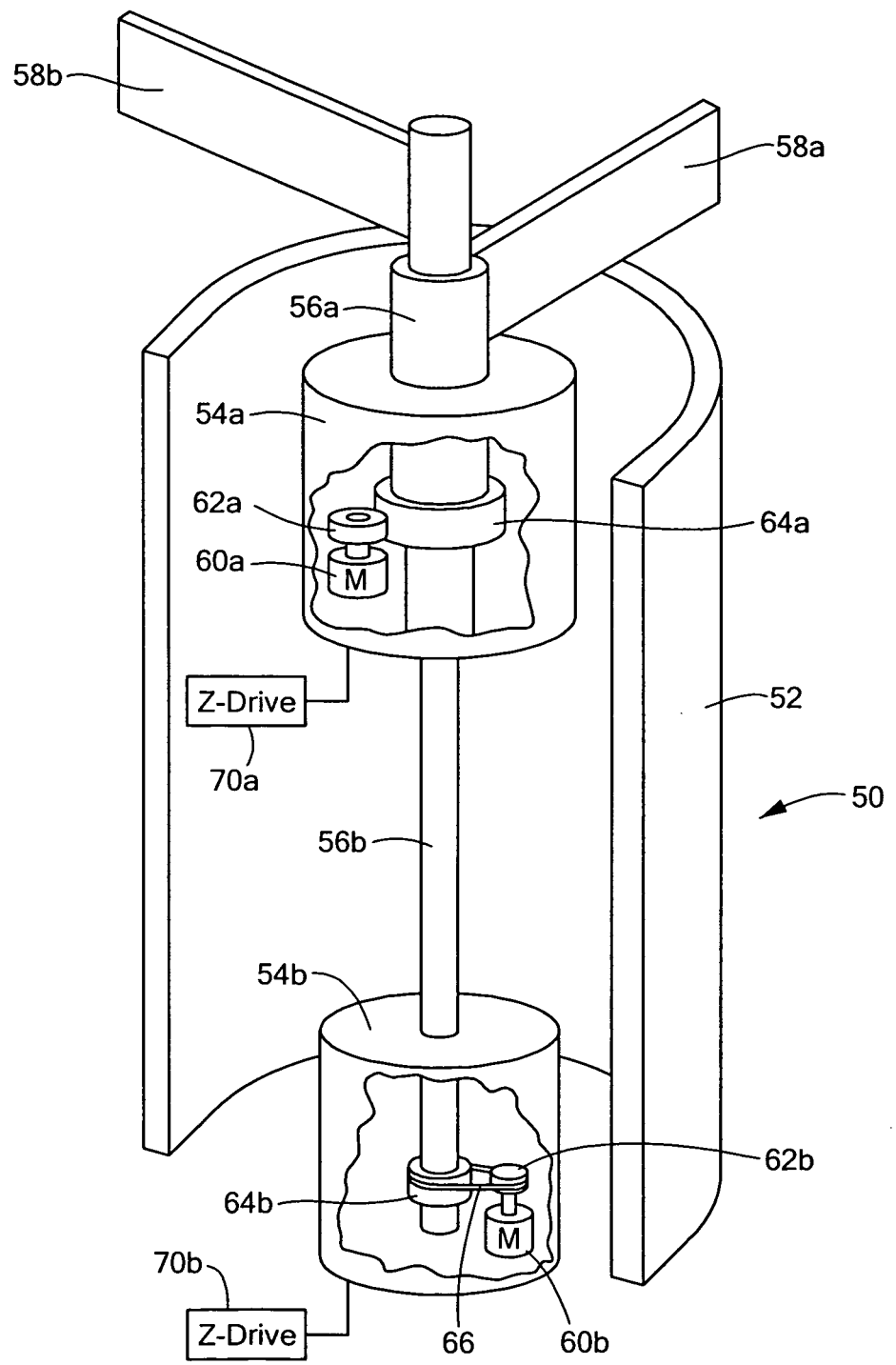
FIG. 3 is a schematic, three dimensional, partially cut away front view showing still another embodiment of a substrate handling robot drive.

For example, FIG. 3 shows drive unit 50 with chassis or fixture 52 for housings 54a and 54b. Housing 54a is associated with external shaft 56a connected to robot arm 58a. The motor subsystem for housing 54a includes motor 60a driving gear 62a meshed with gear 64a about and fixed to shaft 56a. Z-axis drive 70a drives housing 54a and thus robot arm 58a up and down lifting it and lowering it for enhanced functionality.

Housing 54b includes motor 60b driving pulley 62b itself driving pulley 64b fixed about inner shaft 56b via belt 66. Robot arm 58b is connected to inner shaft 56b and it is driven up and down via Z drive 70b. Alternatively, shaft 56b could drive a component of arm 58a. Various guides, slides, bearings, and the like can be used to guide housings 54a and 54b as they are driven up and down with respect to fixture 52. The result in one preferred embodiment is at least two independently rotated arms (or arm segments) each also independently moved up and down.

Figure 4:
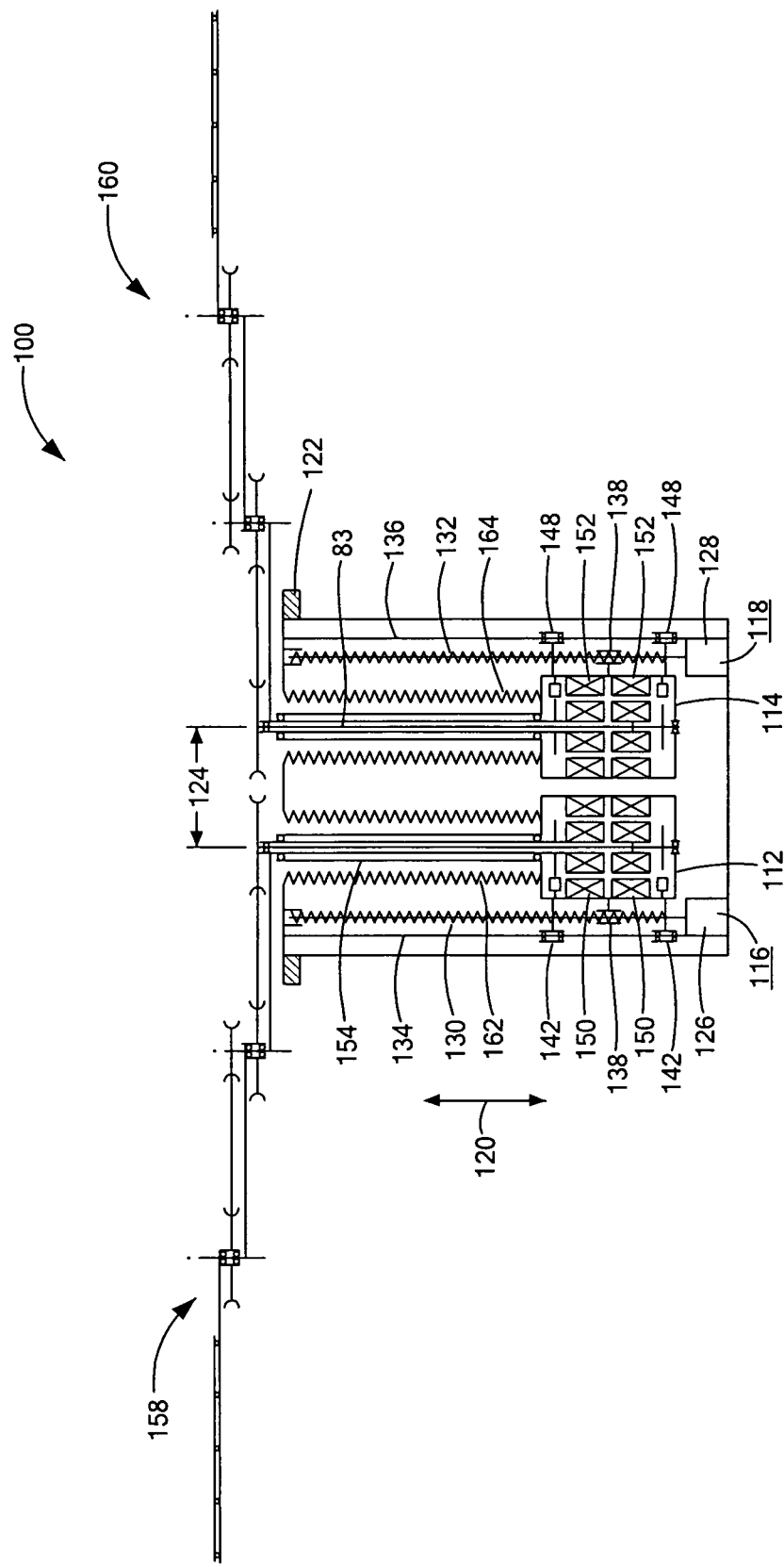
FIG. 4 is a schematic cross sectional view showing another embodiment of a substrate handling robot drive.

Referring now to FIG. 4, there is shown a schematic cross sectional view showing another embodiment of a substrate handling robot drive. Robot drive 100 is shown having chassis 110 and first and second motor housings 112, 114. Chassis 110 may be mounted to chamber 122, where chamber 122 may be a vacuum chamber or other suitable chamber, controlled environment or otherwise. First and second motor housings 112, 114 have independently operable Z axis drives 116, 118 that may independently move drive housings 112, 114 and a Z direction 120. Here the Z direction may be a vertical direction, where vertical drive shafts associated with drive housings 112, 114 may be moved parallel to each other but offset by a selectable distance 124. Z drives 116, 118 may be coupled to chassis 110 and may respectively have motors 126, 128 driving lead screws 130, 132 with housings 112, 114 guided and constrained vertically by slides or rails 134, 136. Nuts 138, 140 and blocks 142, 144 may be respectively coupled to housings 112, 114 where screws 130, 132 rotate to drive nuts 138, 140, respectively and independently, and where blocks 142, 144 are guided on rails 134 and 136 respectively. Housing 112, 114 may form a vacuum tight chamber and include motor/encoders 150, 152 mounted therein driving offset 124 pairs of concentric shafts 154, 156, where shafts 154, 156 may drive arms 158, 160 as preciously described or as any suitable type of arm. Housings 112, 114 may further be coupled to chassis 110 by bellows 162, 164 where the interior of housings 112, 114, the interior of bellows 162, 164 and the upper portion of chassis 110 cooperate with chamber 122 to form a vacuum environment therein. Although concentric shafts are shown, any suitable drive may be employed within housings 112, 114. Although housings 112, 114 are shown with two motors each, more or less motors may be provided. Similarly, pairs of concentric shafts 154, 156 may have more or less shafts, for example, where tri-axial, quad or single shaft arrangements are used. Similarly, one drive housing may have more or less shafts than the other. Although arms 158, 160 are shown as SCARA type anus, any suitable arm or combination of arms (same or different from each other) may be provided. For example, each housing may have tri-axial drives and each arm may be a SCARA type arm as shown but with an additional pulley driving each wrist and associated end effector(s) independently with the third axis of the tri-axial arrangement. Accordingly, all such combinations are embraced as applied to any embodiment herein. By way of example and referring to FIG. 19, an exemplary tri-axial drive and arm 400 are shown. Drive and arm 400 may be used as an alternative to the SCARA or other types of arms disclosed herein. For example, drive and arm 400 may be used in conjunction with an additional drive and arm 400 in a concentric arrangement as shown in FIGS. 1-3 or in a parallel arrangement as shown in FIG. 4. Here, more than one, such as two, three or otherwise, drive and arm 400, FIG. 19, may have independent Z axis drives and may be independently operable as four axis drive units. Drive unit 400 includes frame 410 that may be moveable in Z axis direction and first, second and third concentric shafts 414, 416, 418 driven through pulleys respectively by first, second and third motors 420, 422, 424. Controller 426 controls motion of the motors with appropriate feedback, position or otherwise. Seals (not shown) may be provided, being either rotary, stationary or linear, such as bellows, where the seals may isolate a vacuum or other environment from an atmospheric environment. Motor 420 through shaft 414 controls rotation of pulley 430 where pulley 430 is coupled to pulley 432 grounded to link 434. As such, motor 420 may selectively control rotation of link 434. Motor 422 through shaft 416 is coupled to link 436. As such, motor 422 may selectively control rotation of link 436. Motor 424 through shaft 418 is coupled to pulley 438 which is in turn coupled to pulley 440 grounded to pulley 442 which in turn is coupled to pulley 446 grounded to end effector 448. As such, motor 424 may selectively control rotation of end effector 448. Although bands, pulleys, shafts and motors are shown, any suitable combination of elements may be provided to selectively control the two links and end effector independently.

Figure 5:
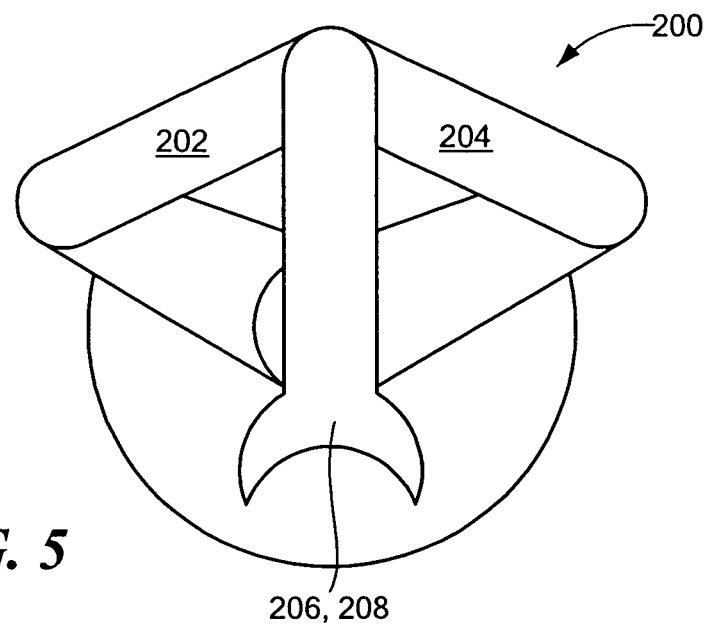
FIG. 5 is a top view of one example of a substrate handling robot incorporating the substrate handling robot drive of one embodiment of the disclosed embodiments.
Figure 6:
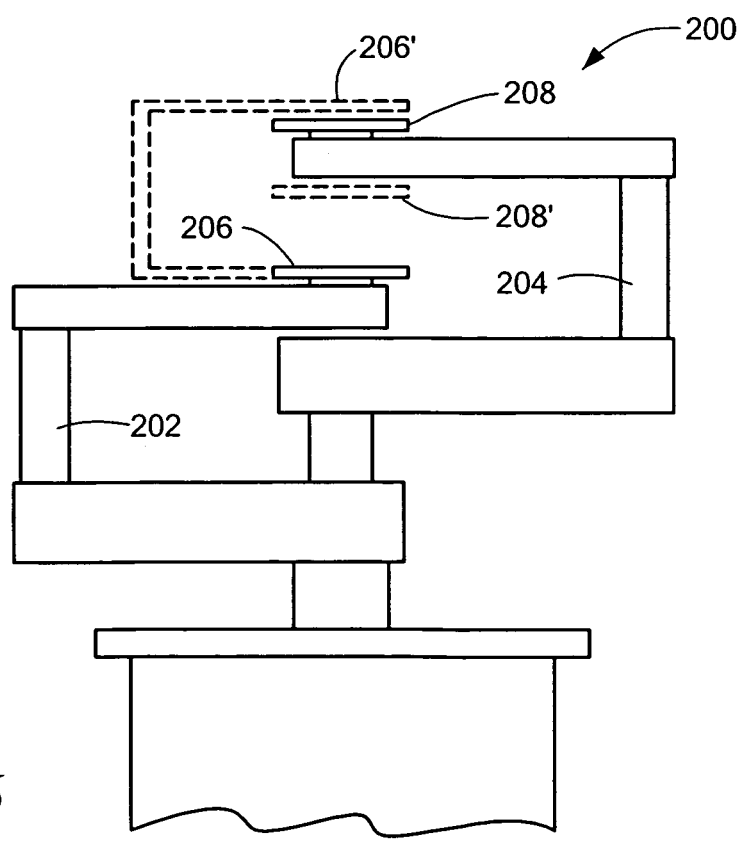
FIG. 6 is a partial side view of one example of a substrate handling robot incorporating the substrate handling robot drive of one embodiment of the disclosed embodiments.

Referring now to FIG. 5, there is shown a top view of substrate handling robot 200. Referring also to FIG. 6, there is shown a partial side view of a substrate handling robot 200. Robot 200 has first and second arms 202, 204 each respectively having first and second end effectors 206, 208. First and second arms 202, 204 may be independently operable in rotation, extension and in vertical or Z axis direction as discussed above. First and second end effectors 206, 208 may be constrained to radially as discussed above with respect to one or more of FIGS. 1-4. Alternately first and second end effectors 206, 208 may be rotatable with respect to each corresponding wrist joint as independent axis of rotation. Each drive housing may employ tri-axial drives instead of coaxial drives as discussed above described. In the embodiment shown, the links of first and second arms 202, 204 may be the same length and interleaved, where first and second end effectors 206, 208 may be positioned on the upper portion of the respective wrist of first and second arms 202, 204 as shown in FIG. 6. Alternately, the links of first and second arms 202, 204 may have different lengths or different configurations. Alternately, one or both of first and second end effectors 206, 208 may be positioned on the lower portion of its respective wrist, for example as shown with respect to end effector position 208'. Alternately one or more bridges may be provided, for example as shown with respect to bridged end effector position 206'.

Figure 7:
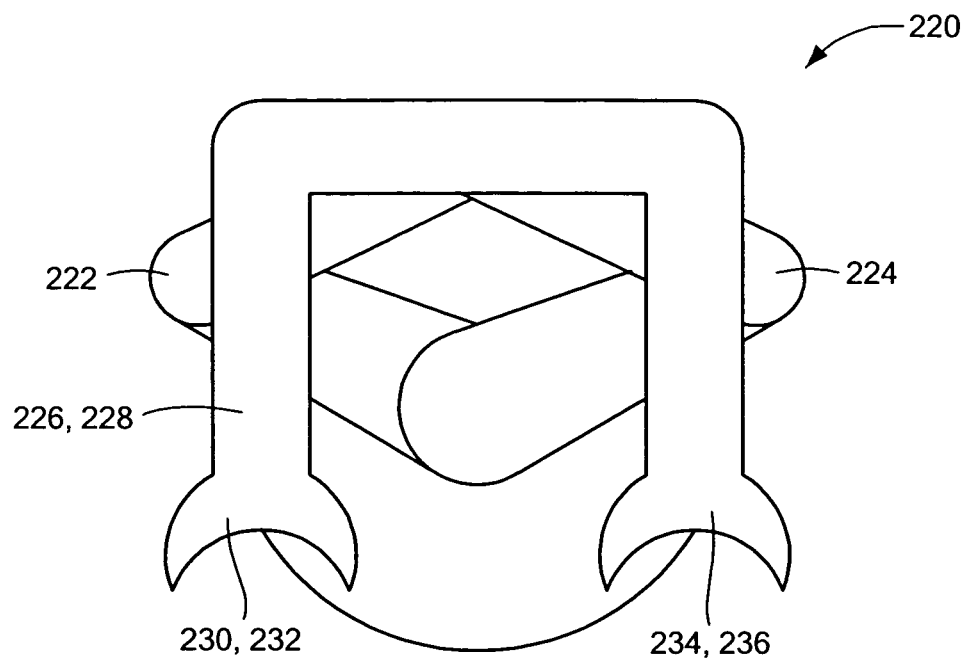
FIG. 7 is a top view of another example of a substrate handling robot incorporating the substrate handling robot drive of one embodiment of the disclosed embodiments.

Referring now to FIG. 7, there is shown a top view of substrate handling robot 220. Robot 220 includes first and second arms 222, 224, each respectively having first and second end effectors 226, 228 one over the other. Robot 220 may have features as previously discussed, but with first and second end effectors 226, 228 each having a pair of offset wafer supporting end effectors 230, 232 and 234, 236 in a quad configuration. In this example, each end effector 226, 228 may support and transport two substrates or wafers at a time. First and second arms 222, 224 may be independently operable in rotation, extension and in vertical or Z axis direction as discussed above. First and second end effectors 226, 228 may be constrained to radially as described with respect to previous embodiments. Alternately first and second end effectors 226, 228 may be rotatable with respect to each corresponding wrist joint as independent axis of rotation. In the embodiment shown, the links of first and second arms 222, 224 may be the same length and interleaved or otherwise be disposed.

Figure 8:
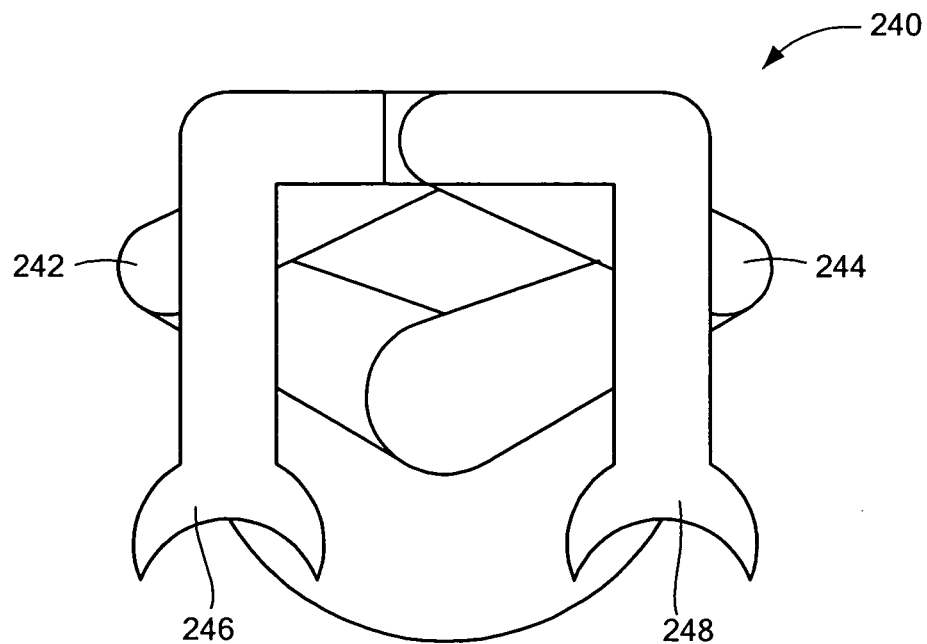
FIG. 8 is a top view of another example of a substrate handling robot incorporating the substrate handling robot drive of one embodiment of the disclosed embodiments.

Referring now to FIG. 8, there is shown a top view of substrate handling robot 240. Robot 240 includes first and second arms 242, 244 each respectively having first and second end effectors 246, 248 one next to the other. Robot 240 may have features as previously discussed but with first and second end effectors 246, 248 each having a single offset wafer supporting end effector. Here, each end effector 246, 248 may support and transport a wafer or substrate, where first and second arms 242, 244 may be independently operable in rotation, extension and in vertical or Z axis direction as described. In this embodiment, arms 242, 246 may simultaneously or independently pick or place two substrates, where positioning of each substrate is independent of the other, for example, arms 242, 246 may pick or place two substrates simultaneously, where the two substrates may be located next to each other in substantially the same plane or different plane. First and second end effectors 246, 248 may be constrained to radially as described with respect to previous embodiments. Alternately first and second end effectors 246, 248 may be rotatable with respect to each corresponding wrist joint as independent axis of rotation. In the embodiment shown, the links of first and second arms 242, 244 may be the same length and interleaved or otherwise be disposed.

Figure 9:
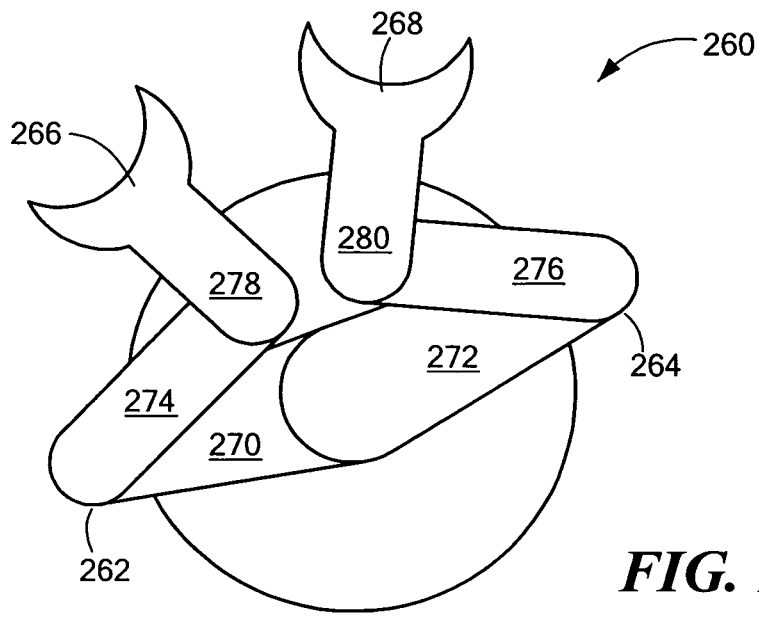
FIG. 9 is a top view of another example of a substrate handling robot incorporating the substrate handling robot drive of one embodiment of the disclosed embodiments.
Figure 13:
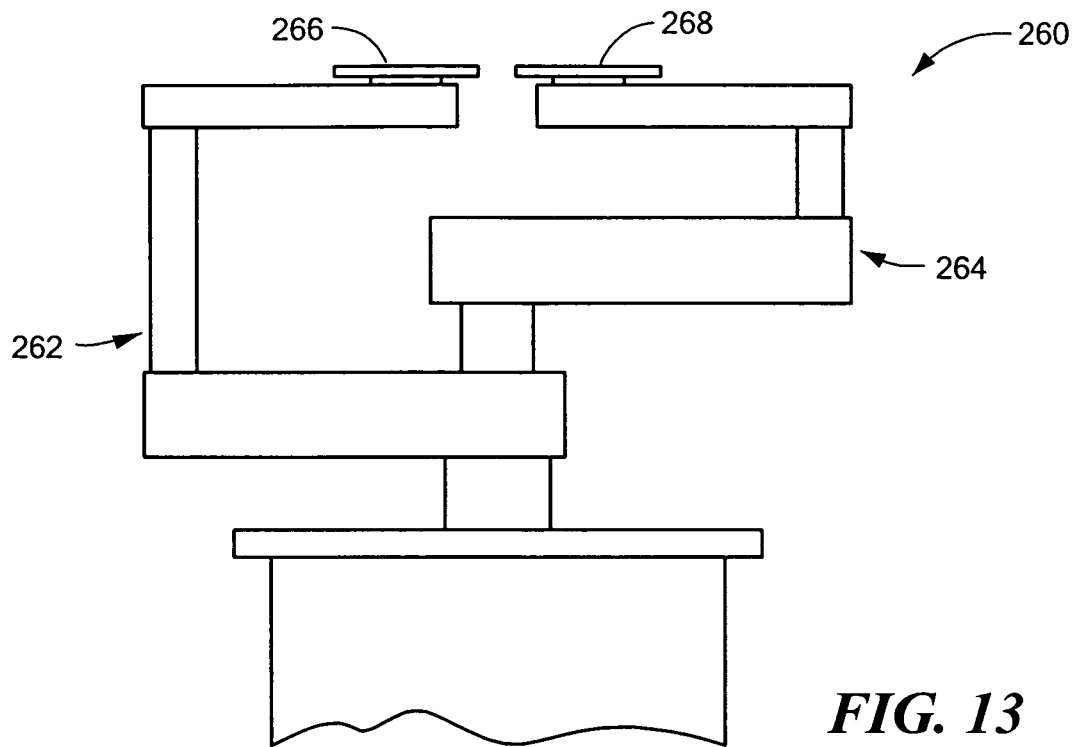
FIG. 13 is a partial side view of another example of a substrate handling robot incorporating the substrate handling robot drive of one embodiment of the disclosed embodiments.
Figure 17:
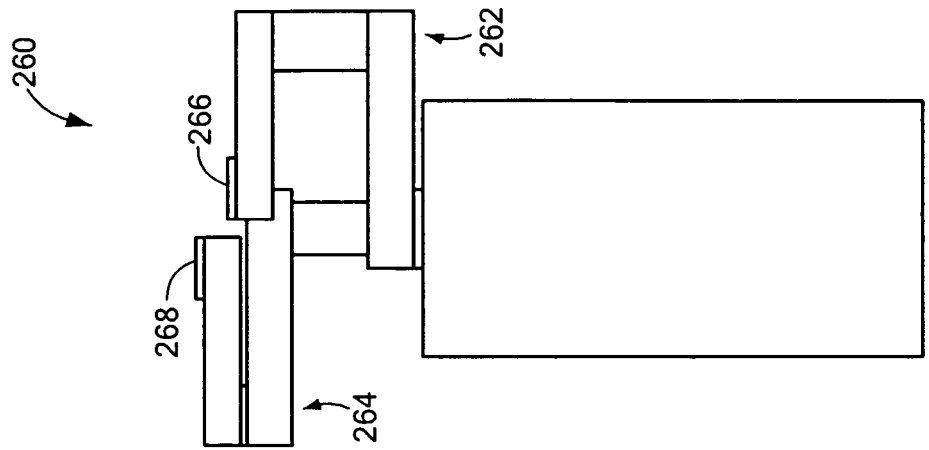
FIG. 17 is a side view of another example of a substrate handling robot incorporating the substrate handling robot drive of one embodiment of the disclosed embodiments.
Figures 18, 19:
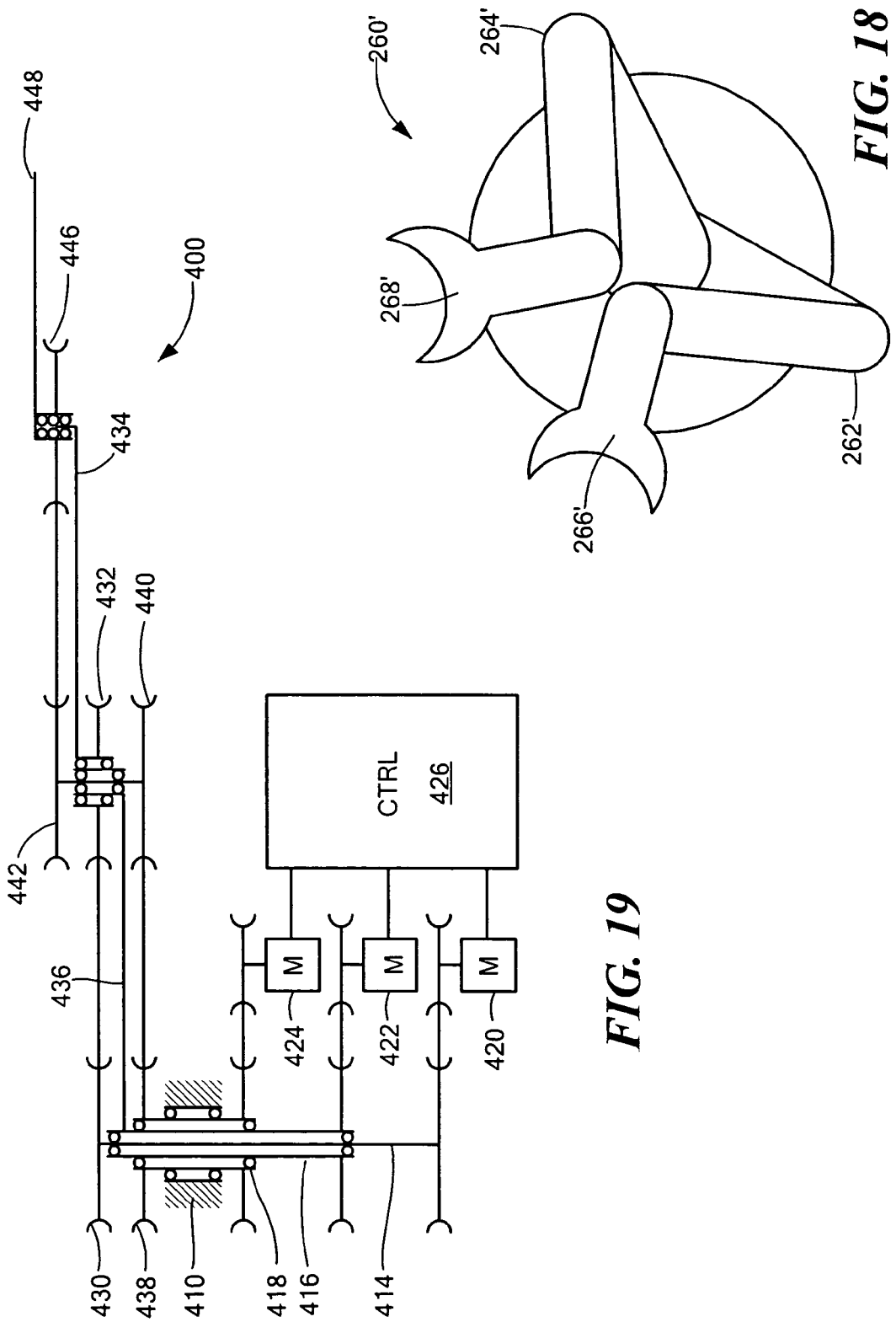
FIG. 18 is a top view of another example of a substrate handling robot incorporating the substrate handling robot drive of one embodiment of the disclosed embodiments.
FIG. 19 is a partial side view of a portion of a substrate handling robot incorporating the substrate handling robot drive of one embodiment of the disclosed embodiments.

Referring now to FIG. 9, there is shown a top view of substrate handling robot 260. Referring also to FIG. 13, there is shown a partial side view of substrate handling robot 260. Robot 260 includes first and second arms 262, 264 each respectively having first and second end effectors 266, 268, one next to the other. Robot 260 may include features as previously described with first and second end effectors 266, 268 each having a single wafer supporting end effector. Here, each end effector 266, 268 may support and transport a wafer or substrate where first and second arms 262, 264 may be independently operable in rotation, extension and in vertical or Z axis direction as described. In this embodiment, arms 262, 264 may simultaneously or independently pick or place two substrates, where positioning of each substrate is independent of the other. First and second end effectors 266, 268 may be constrained radially or otherwise. Alternately first and second end effectors 266, 268 may be rotatable with respect to each corresponding wrist joint as independent axis of rotation. In the embodiment shown, the links of first and second arms 262, 264 may be different lengths. For example, arms 262, 264 may have upper arms 270, 272 having the same lengths with shorter forearms 274, 276 as shown, for example to extend the workspace or to prevent interference of wrists 278, 280. In alternate aspects, any suitable lengths may be provided. In FIG. 9, an unequal link arm configuration is shown with arms 262, 264 having shorter forearms 274, 276 than the upper arms 270, 272 and configured such that arms 262, 264 can retract beyond the center of the robot as they can pass in a side-by-side manner and also move to different Z-axis elevations as they can pass each other as seen with a combination of the disclosed embodiment shown in FIG. 9 with the disclosed embodiments shown in FIGS. 15 to 17, where the forearms are shorter than the upper arms. Referring also to FIG. 18, there is shown a top view of substrate handling robot 260'. Robot 260' has first and second arms 262', 264' having first and second end effectors 266', 268' where the first and second arms 262', 264' may be independently operable in rotation, extension and in vertical or Z axis direction, as discussed above. First and second end effectors 266', 268' may be constrained to radially as discussed above with respect to one or more of FIGS. 1-4 or may be independently rotatable as discussed above with respect to FIG. 19, or otherwise. In the embodiment shown in FIG. 18, the links of first and second arms 262', 264' may be the same length with end effectors 266' and 268' nominally operable at the same Z level, for example as shown in FIG. 13 and FIGS. 15-17 or interleaved when operated at different Z levels, for example, where the respective upper arms may be operable at the same level or interleaved when at different levels. In alternate aspects, any suitable type of arm or combination may be provided.

Figure 10:
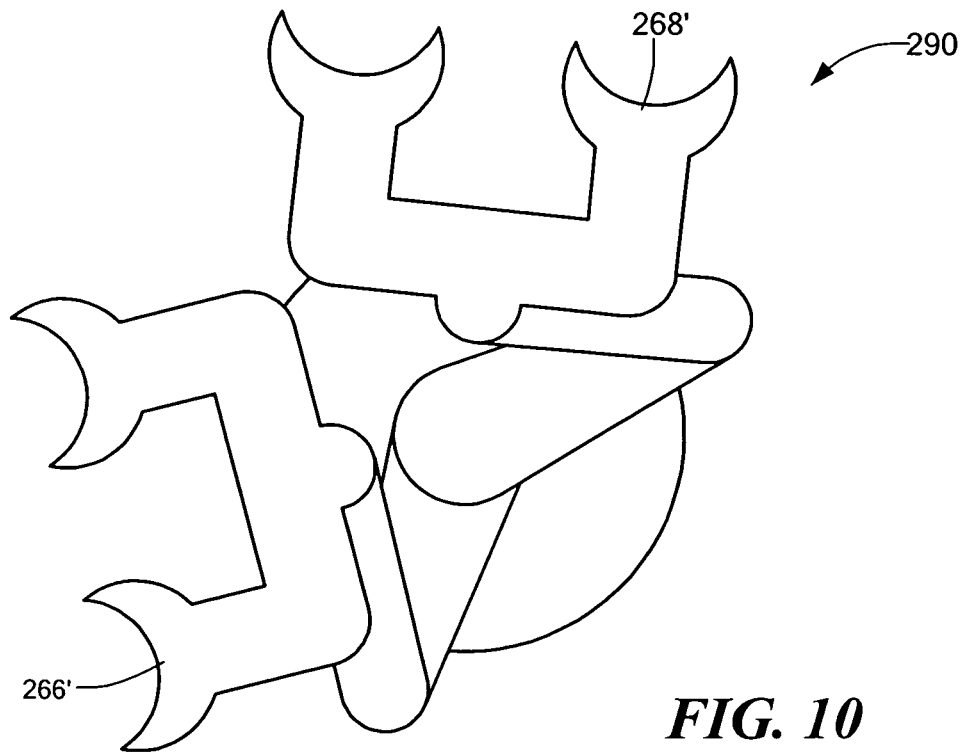
FIG. 10 is a top view of another example of a substrate handling robot incorporating the substrate handling robot drive of one embodiments of the disclosed embodiments.

Referring now to FIG. 10, there is shown a top view of substrate handling robot 290. Robot 290 may have features as discussed above with respect to FIG. 9 and robot 260 but where first and second end effectors 266', 268' have a quad configuration with each end effector 266', 268' capable of supporting two substrates or wafers. Robot 290 may have features as previously described with first and second end effectors 266', 268' each having two wafer supporting end effectors. Here each end effector 266', 268' may support and transport two wafers or substrates and may be independently operable in rotation, extension and in vertical or Z axis direction as described and may simultaneously or independently pick or place two substrates each.

Figure 11:
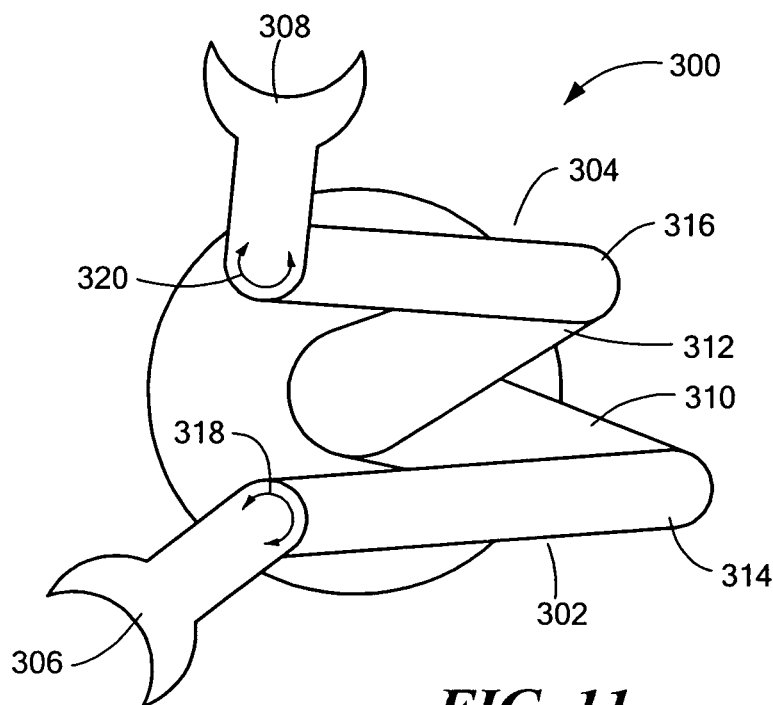
FIG. 11 is a top view of another example of a substrate handling robot incorporating the substrate handling robot drive of one embodiment of the disclosed embodiments.

Referring now to FIG. 11, there is shown a top view of substrate handling robot 300. Robot 300 includes first and second arms 302, 304 each respectively having first and second end effectors 306, 308. Robot 300 may have features as previously described with first and second end effectors 306, 308 each having a single wafer supporting end effector. Here, each end effector 306, 308 may support and transport a wafer or substrate, where first and second arms 302, 304 may be independently operable in rotation, extension and in vertical or Z axis direction as described. In this embodiment, arms 302, 304 may simultaneously or independently pick or place two substrates where positioning of each substrate is independent of the other. First and second end effectors 306, 308 may be rotatable with respect to each corresponding wrist joint 318, 320 as independent axis of rotation. In the embodiment shown, the links of first and second arms 302, 304 may be different lengths. For example, arms 302, 304 may have upper arms 310, 312 having different lengths with longer forearms 314, 316 as shown. In alternate aspects, any suitable lengths may be provided.

Figure 12:
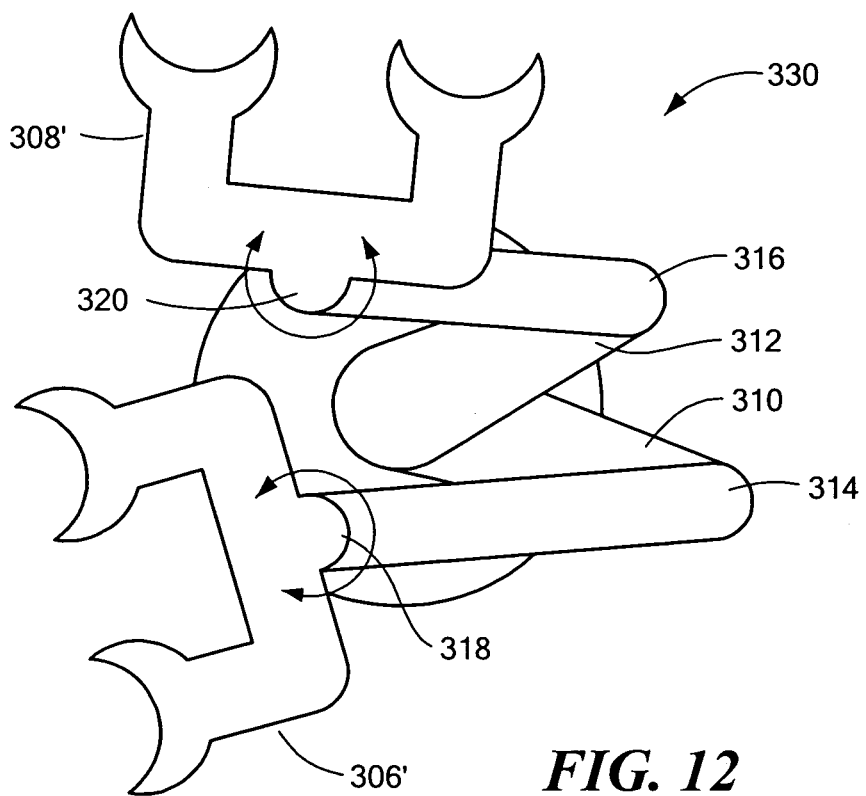
FIG. 12 is a top view of another example of a substrate handling robot incorporating the substrate handling robot drive of one embodiment of the disclosed embodiments.

Referring now to FIG. 12, there is shown a top view of substrate handling robot 330. Robot 330 may include features as discussed above with respect to FIG. 11 and robot 300 but where first and second end effectors 306', 308' have a quad configuration with each end effector 306', 308' capable of supporting two substrates or wafers. Robot 330 may include features as previously described with first and second end effectors 306', 308' each having two wafer supporting end effectors. Here, each end effector 306', 308' may support and transport two wafers or substrates and may be independently operable in rotation, extension and in vertical or Z axis direction as described and may simultaneously or independently pick or place two substrates each.

Figure 14:
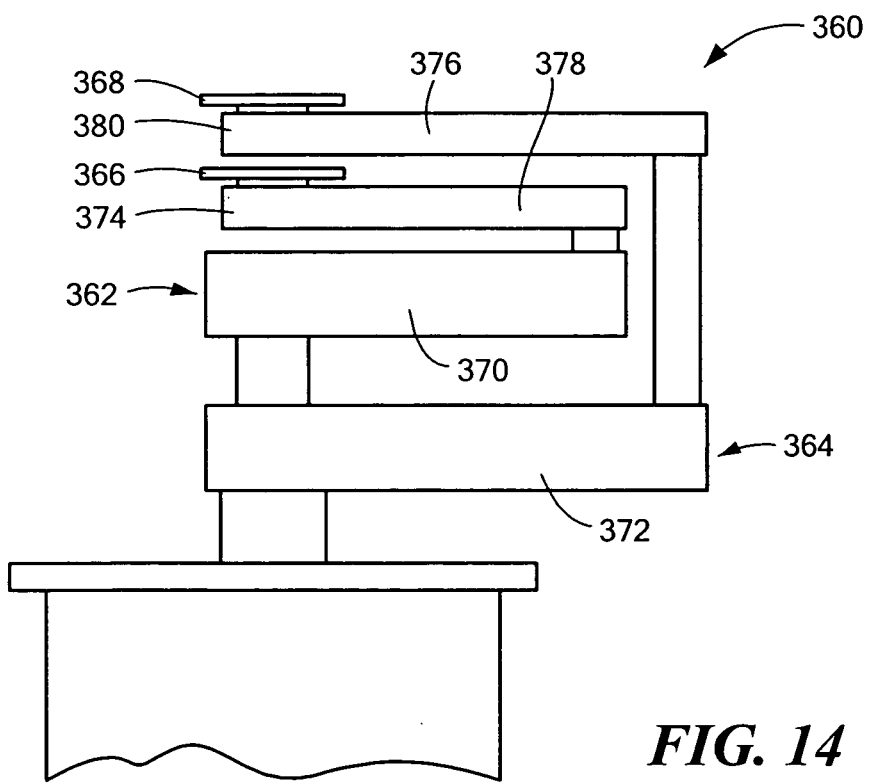
FIG. 14 is a partial side view of another example of a substrate handling robot incorporating the substrate handling robot drive of one embodiment of the disclosed embodiments.

Referring now to FIG. 14, there is shown a partial side view of substrate handling robot 360. Robot 360 includes first and second arms 362, 364 each respectively having first and second end effectors 366, 368 one over the other. Robot 360 may have features as previously described with first and second end effectors 366, 368 each having a single or multiple wafer supporting end effector. Here, each end effector 366, 368 support and transport a wafer or substrate, where first and second arms 362, 364 may be independently operable in rotation, extension and in vertical or Z axis direction as described. In this embodiment, arms 362, 364 may simultaneously or independently pick or place two or more substrates where positioning of each substrate is independent of the other. First and second end effectors 366, 368 may be constrained radially or otherwise. Alternately first and second end effectors 366, 368 may be rotatable at wrists 378, 380 with respect to each corresponding wrist joint as independent axis of rotation. In the embodiment shown, the links of first and second arms 362, 364 may be different lengths. For example, arms 362, 364 may have upper arms 370, 372 having different lengths with forearms 374, 376 having the same length as upper arms 370, 372 respectively as shown, for example to prevent interference of arms 362, 364 where arms 362, 364 may be interleaved as shown. In alternate aspects, any suitable lengths may be provided.

Figure 16:
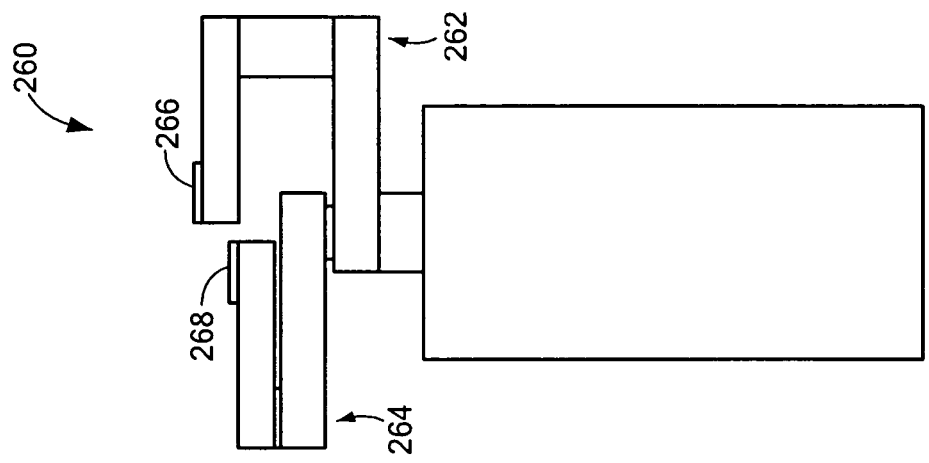
FIG. 16 is a side view of another example of a substrate handling robot incorporating the substrate handling robot drive of one embodiment of the disclosed embodiments.
Figure 15:
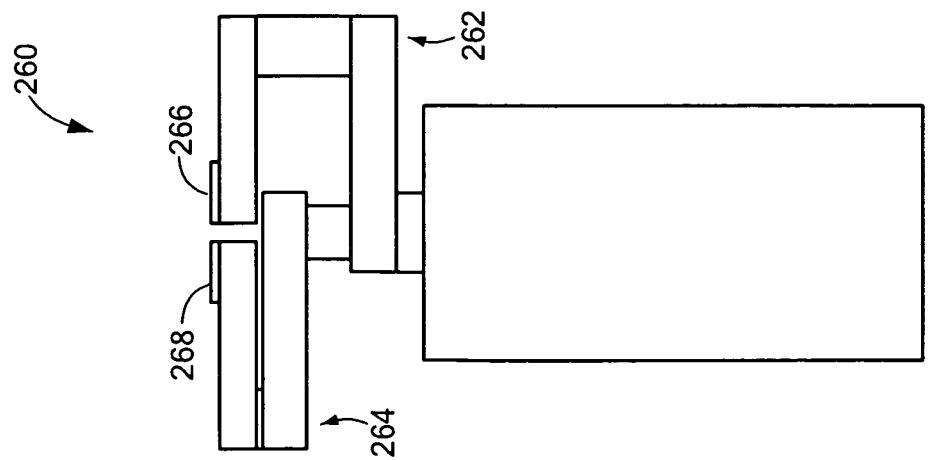
FIG. 15 is a side view of another example of a substrate handling robot incorporating the substrate handling robot drive of one embodiment of the disclosed embodiments.

Referring now to FIG. 15, there is shown a side view of substrate handling robot 260. Referring also to FIG. 16, there is shown a side view of substrate handling robot 260. Referring also to FIG. 17, there is shown a side view of substrate handling robot 260. FIG. 15 shows arms 262, 264 with the end effectors 266, 268 at the same level. FIG. 16 shows arms 262, 264 with the end effector 266 at a higher Z level than end effector 268. FIG. 17 shows arms 262, 264 with the end effector 266 at a lower Z level than end effector 268 where the wrist of arm 262 is offset to avoid interference with the upper arm of arm 264.

But, although specific features of the invention are shown in some drawings and not in others, this is for convenience only as each feature may be combined with any or all of the other features. The words "including", "comprising", "having", and "with" as used herein are to be interpreted broadly and comprehensively and are not limited to any physical interconnection. Moreover, any embodiments disclosed in the subject application are not to be taken as the only possible embodiments.

Although specific features of the disclosed embodiment or embodiments are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A substrate handling robot drive comprising:
   a drive chassis for one or more robot arms;
   a first housing movable with respect to the chassis and including:
      at least a first shaft, and
      a first motor subsystem driving the first shaft;
   a Z-axis drive for the first housing;

a second housing movable with respect to the chassis and including:
   at least a second shaft, and
   a second motor subsystem driving the second shaft, and
a Z-axis drive for the second housing independently movable with respect to the Z-axis drive for the first housing.

2. The substrate handling robot drive of claim 1 in which the first and second shafts are co-axial and independently rotatable.

3. The substrate handling robot drive of claim 2 in which the Z-axis drive for the first housing includes a first motor driven screw in the chassis and a ball assembly attached to the first housing and driven by the first motor driven screw.

4. The substrate handling robot drive of claim 3 in which the Z-axis drive for the second housing includes a second motor driven screw in the chassis and a ball assembly attached to the housing and driven by the second motor driven screw.

5. The substrate handling robot chassis of claim 1 in which the Z-axis drive for the first housing includes a screw in the chassis and a motor driven ball assembly associated with the first housing.

6. The substrate handling robot drive of claim 5 in which the Z-axis drive for the second housing includes another motor driven ball assembly associated with the second housing and said screw.

7. The substrate handling robot drive of claim 1 further including at least a first guide rail attached to the chassis.

8. The substrate handling robot drive of claim 7 further including at least one bearing associated with the first housing and the first guide rail.

9. The substrate handling robot drive of claim 7 further including at least one linear bearing associated with the second housing and the first rail.

10. A substrate transport robot comprising:
   a first housing including a first screw rotatable in a chassis adapted to drive a first ball assembly associated with the first housing, the first housing movable in a Z-axis with respect to the chassis, the first housing having at least a first shaft rotatable about an axis;
   a second housing movable with respect to the Z-axis chassis, the second housing having at least a second shaft rotatable about said axis independently of rotation of said first shaft about said axis; and
   the first housing movable in the Z-axis an axial direction with respect to said axis independent of the Z-axis of the second housing.

11. The substrate transport robot of claim 10 wherein the second housing includes a second screw rotatable in the chassis adapted to drive a second ball assembly associated with the second housing.

12. The substrate transport robot of claim 10 wherein the first housing includes a first ball assembly associated with the first housing rotatable about a fixed screw attached to the chassis.

13. The substrate transport robot of claim 12 wherein the second housing includes a second ball assembly associated with the second housing rotatable about the fixed screw attached to the chassis.

14. The substrate transport robot of claim 12 wherein the first and second housings are guided on a common rail.

* * * * *